United States Patent
Royon et al.

(10) Patent No.: US 10,859,888 B2
(45) Date of Patent: Dec. 8, 2020

(54) SYSTEM FOR GENERATING BRIEF OR ULTRA-BRIEF LIGHT PULSES

(71) Applicant: IRISIOME, Talence (FR)

(72) Inventors: Romain Royon, Dax (FR); Romain Dubrasquet, Sabres (FR)

(73) Assignee: IRISIOME, Talence (FR)

( * ) Notice: Subject to any disclaimer, the term of this patent is extended or adjusted under 35 U.S.C. 154(b) by 0 days.

(21) Appl. No.: 16/318,471

(22) PCT Filed: Jul. 20, 2017

(86) PCT No.: PCT/FR2017/052000
§ 371 (c)(1),
(2) Date: Jan. 17, 2019

(87) PCT Pub. No.: WO2018/015682
PCT Pub. Date: Jan. 25, 2018

(65) Prior Publication Data
US 2019/0235346 A1  Aug. 1, 2019

(30) Foreign Application Priority Data
Jul. 20, 2016 (FR) .................................. 16 56900

(51) Int. Cl.
| | | |
|---|---|---|
| G02F 1/225 | (2006.01) | |
| H01S 3/067 | (2006.01) | |
| H01S 3/23 | (2006.01) | |
| H01S 5/062 | (2006.01) | |
| H01S 3/00 | (2006.01) | |

(52) U.S. Cl.
CPC ............ *G02F 1/2252* (2013.01); *G02F 1/225* (2013.01); *H01S 3/0057* (2013.01);
(Continued)

(58) Field of Classification Search
None
See application file for complete search history.

(56) References Cited

U.S. PATENT DOCUMENTS 5,548,603 A * 8/1996 Calvani ................. H01S 5/0014
372/20
9,958,708 B1 * 5/2018 Kang ..................... G02F 1/0121
(Continued)

FOREIGN PATENT DOCUMENTS

FR    3 001 053 A1    7/2014

OTHER PUBLICATIONS

Optilab: "1550 nm Programmable Picosecond Laser, PM", Jul. 13, 2016 (Jul. 13, 2016), XP055361947, Retrieved from the Internet <URL:http://www.optilab.com/images/datasheets/PPL-1064-PM_07132016_v1.pdf> [retrieved on Apr. 5, 2017].
(Continued)

*Primary Examiner* — Michael Stahl
(74) *Attorney, Agent, or Firm* — Nixon & Vanderhye

(57) ABSTRACT

Disclosed is a system for generating short or ultra-short light pulses, including a light source configured to emit temporally continuous-wave light radiation, an electrical generator configured to operate at a tunable frequency in a passband included between 5 and 100 GHz and to emit an analogue modulating electrical signal including at least one electrical pulse of duration included between 10 ps and 100 ps, and an electro-optical modulator having electrodes and an electrical passband that are suitable for receiving the analog modulating electrical signal, the electro-optical modulator being configured to optically amplitude modulate the continuous-wave light radiation depending of the analog modulating electrical signal and to generate modulated light radiation including at least one light pulse of duration included between 10 ps and 100 ps.

19 Claims, 2 Drawing Sheets

(52) U.S. Cl.
CPC .......... *H01S 3/0085* (2013.01); *H01S 3/0092* (2013.01); *H01S 3/06758* (2013.01); *H01S 3/2375* (2013.01); *H01S 5/06226* (2013.01); *G02F 2203/26* (2013.01); *G02F 2203/54* (2013.01)

(56) References Cited

U.S. PATENT DOCUMENTS

2006/0017920 A1* 1/2006 Tsuchiya ............ G01N 21/6458
356/317
2014/0300951 A1 10/2014 Messerly et al.
2016/0341664 A1* 11/2016 Rothberg ............ G01N 21/6408

OTHER PUBLICATIONS

Ozeki Y et al: "Repetition rate and wavelength tunable picosecond optical pulse source employing square-wave-driven modulator, comb-like profiled fibre compressor and pulse timing stabilizer", 31st European Conference on Optical Communication—Sep. 25-29, 2005—Glasgow, UK, London : Institution of Electrical Engineers, GB, Sep. 25, 2005 (Sep. 25, 2005), pp. 41-42 vol. 1, XP032173339, ISBN: 978-0-86341-543-2.

Iredale T B et al: "40 GHz sub-picosecond pulse generation from a Mach-Zehnder modulator and its application to 320 Gb/s OTDM", Optical Fiber Communication—Incudes Post Deadline Papers, 2009. OFC 2009. Conference on, IEEE, Piscataway, NJ, USA, Mar. 22, 2009 (Mar. 22, 2009), pp. 1-3, XP031468087, ISBN: 978-1-4244-2606-5.

International Search Report, dated Nov. 17, 2017, from corresponding PCT/FR2017/052000 application.

Taira K et al: "Picosecond pulse generation with high extinction ratio employing electroabsorption modulator, fibre compressor, and self-phase-modulation-based pulse reshaper", Electronics Letters, IEE Stevenage, GB, vol. 40, No. 1, Jan. 8, 2004 (Jan. 8, 2004), pp. 15-16, XP006024614, ISSN: 0013-5194, DOI: 10.1049/EL:20040057.

* cited by examiner

SYSTEM FOR GENERATING BRIEF OR ULTRA-BRIEF LIGHT PULSES

TECHNICAL FIELD TO WHICH THE INVENTION RELATES

The present invention generally relates to the field of light pulse generating systems and lasers.

It more particularly relates to a system and a method for generating short or ultra-short light pulses, these light pulses being tunable in rate or repetition frequency.

It relates in particular to a system and a method for generating ultra-short light pulses being moreover tunable in duration and/or in wavelength.

TECHNOLOGICAL BACK-GROUND

The use of short to ultra-short light pulses find many applications in the scientific, industrial or medical fields. In the present document, it is meant by short light pulse, a light pulse having a duration comprised between several picoseconds and a few picoseconds. It is meant by ultra-short light pulse, a light pulse having a duration comprised between about one femtosecond (fs) and about ten picoseconds (ps). In the present document, the terms repetition frequencies and rate are used equivalently.

The optical fibre lasers are currently commonly used for generating short to ultra-short light pulses. In particular, the optical fibres doped with rare earth elements, in particular ytterbium, generally have a wide gain band in the infrared range around 1 μm (generally from 976 to 1200 nm). The combination of a wide-gain-band doped fibre with an active or passive mode locking device makes it possible to generate short (ps) or ultra-short (fs) light pulses. Moreover, these doped fibres have generally a high gain. This high gain makes possible the introduction of optical elements, such as filters, without impairing the operation of such a fibre laser.

The optical fibre laser systems have advantages of compactness and integration. Moreover, the development of double-clad and large-core optical fibres has made possible to generate high-mean-power and/or high-energy light pulses. The optical fiber laser systems are now serious competitors to the diode-pumped solid-state lasers.

Indeed, the optical oscillators based on massive crystals have allowed demonstrating high mean powers, in particular with the thin-disk laser technology to reach pulse energies of several Joules in femtosecond regime.

However, the architectures of these solid-state laser systems are very complex. These crystal laser systems suffer from drawbacks of sensitivity to changes in the external environment. These drawbacks are an obstacle to the integration of solid-state lasers into industrial devices.

Although fibre lasers have certain advantages with respect to the solid-state laser, they still suffer from many drawbacks. In a fibre laser, the light pulses are spatially confined in the reduced volume of an optical fibre. Due to this confinement, the light pulses can be source of nonlinear optical effects liable to limit the energy (or the peak power) of a mode-locked fibre laser. On the other hand, the chromatic dispersion in an optical fibre may also cause dysfunctions, in particular for wavelength-tunable lasers.

Nevertheless, the fibre lasers cover a very wide range from the point of view of both the light pulse wavelengths and the light pulse durations or energies. In practice, this vast choice is however accessible only by implementing a significant number of different fibre laser architectures.

Generally, the process of mode locking in a resonating laser cavity is the mechanism chosen for generating ultra-short light pulses (fs or ps). This mode locking process remains complex because a significant number of longitudinal modes oscillating in the cavity must be phase aligned.

For that purpose, there exist different active or passive mode locking techniques.

The active mode locking consists in placing an acousto-optical or electro-optical modulator in a laser cavity and in actively modulating the losses of the cavity as a function of time. The active mode locking requires the use of an external electrical supply to control the optical modulator. Moreover, the duration of the pulses generated by active mode locking is of the order of a few tens or hundreds of picoseconds.

The passive mode locking lies on the exploitation of nonlinear optical effects in order to generate pulses without using an external optical modulator. Several methods based on the loss variation as a function of the intensity (saturable absorbing effect) are used, as for example: nonlinear semiconductor mirrors (SESAM), nonlinear optical loop mirrors (NOLM), nonlinear amplifying loop mirrors (NALM) or nonlinear polarization rotation (RNLP). Those nonlinear optical techniques operate in precise conditions.

However, these nonlinear optical methods are not easy to use in wavelength, pulse-duration and/or repetition-frequency tunable laser systems.

Indeed, the SESAM technology makes it possible to design and make a variety of elements whose operation is individually adapted to each of the wavelengths of the spectrum of emission of the Ytterbium ion but with a spectral band intrinsically limited to only a few tens of manometers. It is hence not possible to use only one SESAM over an extended wavelength tunability range.

It is the same for the NALM technique, whose operation is based on the gain and the total dispersion of the cavity. Moreover, the degrees of freedom for obtaining the mode locking are extremely reduced and require a high level of mastery of this technology.

Finally, the RNLP uses free-space optical components such as phase plates. These optical components being not available in fibre technology, the use thereof involves propagating the beam in free space out of the fibre. It is hence not possible to make fully-fibred laser sources by this technology. Moreover, a variation of the fibre birefringence by thermal or mechanical effect degrades the mode locking. The orientation of the phase plates must then be frequently adjusted to obtain again a stable pulse train.

Moreover, these systems remain intrinsically rigid as for the repetition rates and the duration of the pulses delivered. Indeed, the pulse duration and the repetition rate are imposed by the characteristics of the laser cavity, in particular the length of the cavity.

There hence exists a need for a system and a method for generating short or ultra-short light pulses, these light pulses being tunable in repetition frequency over a wide frequency range.

There also exists a need for a system and a method for generating short or ultra-short light pulses, these light pulses being tunable in duration over a wide time range and/or in wavelength over a wide spectral range.

OBJECT OF THE INVENTION

In order to remedy the above-mentioned drawback of the state of the art, the present invention proposes a system for generating short or ultra-short light pulses.

More particularly, it is proposed according to the invention a system comprising a light source configured to emit a temporally continuous light radiation, a power generator configured to operate at a frequency tunable over a bandwidth extending up to at least one gigahertz and to emit an analog electrical modulation signal comprising at least one electrical pulse of duration comprised between one picosecond and a few nanoseconds; electrical or electro-optical modulation means having an electrical bandwidth adapted to receive the analog electrical modulation signal, the electrical or electro-optical modulation means being configured to modulate the light radiation in amplitude as a function of the analog electrical modulation signal and to generate a modulated light radiation comprising at least one light pulse of duration comprised between 10 ps and a few nanoseconds.

Preferably, the bandwidth of the power generator extends from continuous to 5 GHz or even 100 GHz.

The system represents a technological breakthrough in the field of short or ultra-short pulse light sources because it uses neither resonating laser cavity nor mode locking. This light pulse generating system has many advantages of compactness, ease of use and operational range. It is easily tunable in light pulse duration, in repetition rate and/or in wavelength.

Other non-limitative and advantageous characteristics of the system for generating short or ultra-short light pulses according to the invention, taken individually or according to all the technically possible combinations, are the following:

- the power generator is configured to emit the analog electrical modulation signal comprising said at least one electrical pulse of duration comprised between 10 ps and a few nanoseconds and the light source comprises a laser diode having electrodes, said modulation means being configured to apply said analog electrical modulation signal to the electrodes of the laser diode;
- the power generator is configured to operate at a frequency tunable over a bandwidth extending up to at least ten gigahertz and to emit the analog electrical modulation signal comprising said at least one electrical pulse of duration comprised between 10 ps and 50 ps and wherein the laser diode is gain switched, so that the laser diode generates the modulated light radiation comprising at least one light pulse of duration comprised between 10 ps and 50 ps at a rate extending up to at least ten gigahertz.

According to a particular and advantageous embodiment, the light source is adapted to emit a temporally continuous light radiation, the power generator is configured to operate at a frequency tunable over a bandwidth comprised between one gigahertz and one hundred of gigahertz and to emit the analog electrical modulation signal comprising said at least one electrical pulse of duration comprised between ten picoseconds and one hundred of picoseconds; and the system further comprises an electro-optical modulator having electrodes and an electrical bandwidth adapted to receive the analog electrical modulation signal, the electro-optical modulator being configured to optically modulate the continuous light radiation in amplitude as a function of the analog electrical modulation signal and to generate a modulated light radiation comprising at least one light pulse of duration comprised between 10 ps and 100 ps.

According to other particular and advantageous aspects:

- the electrical pulse generator is configured to emit an analog electrical modulation signal comprising an electrical pulse train of duration comprised between 10 ps and 10 ns at a rate tunable over a frequency range comprised between 10 kHz and 20 GHz and wherein the electro-optical modulator is configured to modulate the continuous light radiation as a function of the analog electrical modulation signal and to generate a modulated light radiation comprising a train of light pulses of duration comprised between 10 ps and 10 ns, said light pulses having said tunable rate;
- the system further comprises an optical pulse compression device configured to receive said at least one light pulse of duration comprised between ten picoseconds and one hundred of picoseconds and to generate a compressed light pulse of duration lower than or equal to one picosecond;
- the system further comprises at least one optical device arranged between the light source and the compressor, the optical device being chosen among a spectrally dispersive optical device, a polarizing optical device, a self-phase modulation nonlinear optical device and/or a Kerr-effect nonlinear optical device;
- the light source is configured to emit a monochromatic or polychromatic continuous light radiation;
- the system comprises a device for tuning a wavelength of the continuous light radiation;
- the light source comprises a laser diode or a rare-earth-doped optical fibre laser source, chosen among an erbium, ytterbium, thulium or neodymium-doped optical fibre laser source;
- the system comprises an optical amplification device configured to receive the modulated light radiation and to generate an amplified pulse light radiation;
- the system comprises an optical coupler arranged at the exit of the electrical or electro-optical modulation means and configured to pick-up a portion of the modulated light radiation, a detection system configured to measure an intensity of the portion of the modulated light radiation in a bandwidth extending up to at least one gigahertz and preferably up to 5 GHz and even 100 GHz, and a feedback loop arranged to apply a bias signal to the modulation signal as a function of the intensity measured;
- the system comprises a beam-expander optical system arranged to receive the modulated light radiation and to direct an expanded modulated light beam to a zone to be analysed and an image detection system configured to form an image of said zone.

The invention also proposes a method for generating short or ultra-short light pulses comprising the following steps:

- emitting a light radiation, for example temporally continuous,
- generating an analog electrical modulation signal having a microwave bandwidth comprised between 10 kHz and 20 GHz, the analog electrical modulation signal comprising at least one electrical pulse of duration comprised between 10 ps and 100 ps;
- applying the analog electrical modulation signal to the electrodes of an electro-optical modulator or of a laser diode, the electro-optical modulator or the laser diode being configured to optically modulate the continuous light radiation in amplitude as a function of the analog electrical modulation signal and to generate a modulated light radiation comprising at least one light pulse of duration comprised between 10 ps and 100 ps.

In an advantageous variant of the method, the laser diode is gain switched, so that the laser diode generates the modulated light radiation comprising at least one light pulse of duration comprised between 10 ps and 50 ps at a rate extending up to at least ten gigahertz.

DETAILED DESCRIPTION OF AN EXEMPLARY EMBODIMENT

The following description with respect to the appended drawings, given by way of non-limitative examples, will permit a good understanding of what the invention consists in and of how it can be implemented.

In the appended drawings:

FIG. 1 schematically shows a system for generating short or ultra-short light pulses according to an embodiment;

Figure 5:
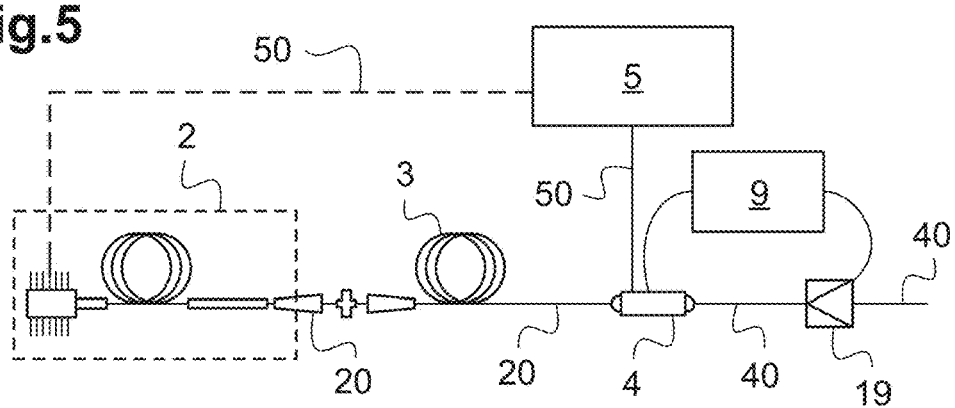
Figure 6:
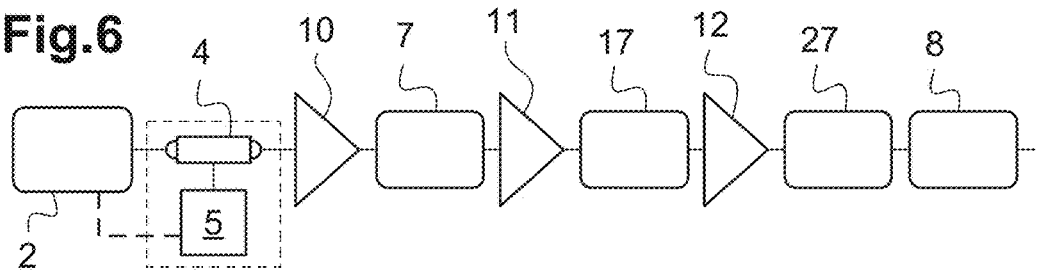
Figure 7:
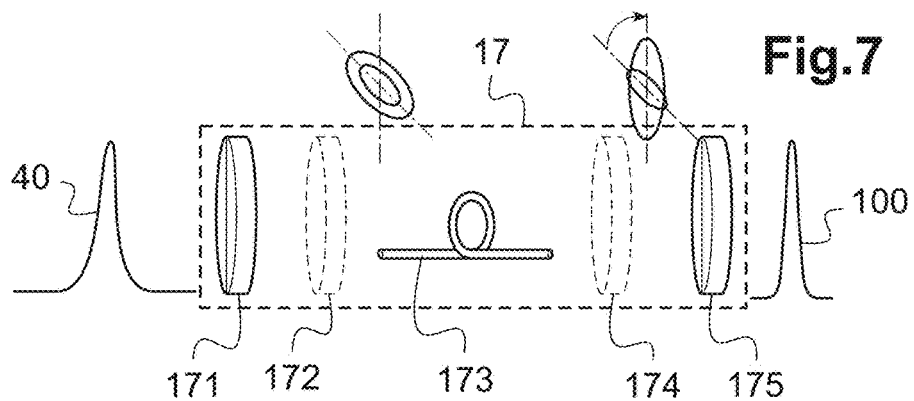
Figure 8:
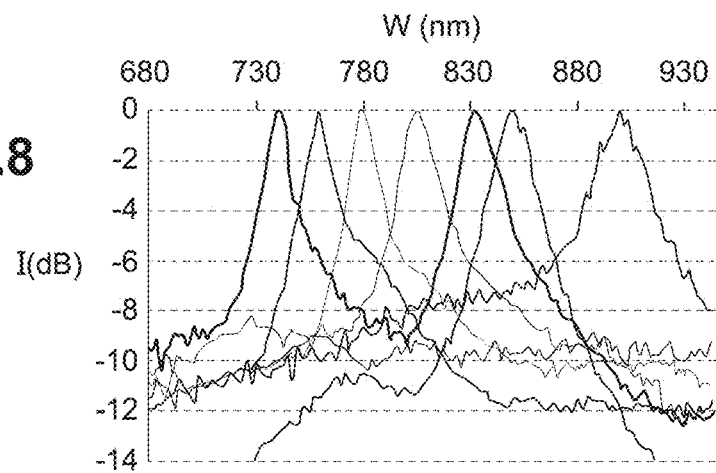

FIG. 5 schematically shows a variant of the light pulse generating system with a feedback loop;

FIG. 6 schematically shows different variants of the light pulse generating system using one or several pulse amplification, dispersion and/or compression devices;

FIG. 7 schematically shows a nonlinear polarization rotation device;

FIG. 8 shows an example of generation of light pulses tunable in wavelength over a wide spectral range.

DEVICE

Figure 1:
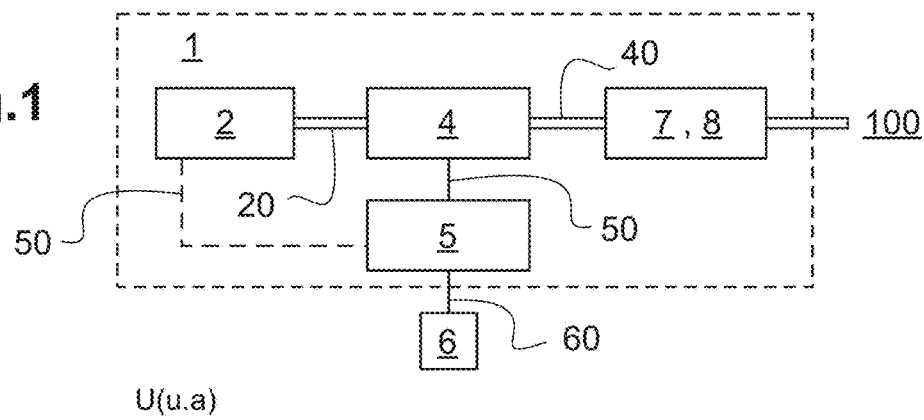

In FIG. 1 is shown a system 1 for generating light pulses 100 that comprises a light source 2, a power generator 5, a control unit 6 and an electro-optical modulator 4. In a variant, the light pulse generating system 1 further includes a light pulse dispersion module 7 and/or compression module 8. In FIG. 1, the electrical signals are represented by a simple line and the light beams by a double line.

The light source 2 emits a light radiation 20 that is temporally continuous. The light source 2 comprises for example a laser source having preferably a fibred exit. Particularly advantageously, the light source 2 emits a wavelength-tunable monochromatic light radiation 20. Preferably, the light source 2 generates a transverse single-mode $TM_{00}$ light radiation.

As an exemplary embodiment, the light source 2 comprises a laser diode that emits a light radiation 20 at a determined wavelength that can be adjusted over a few nanometres as a function of the temperature of the laser diode. In another example, the light source 2 includes for example an optical oscillator and a wavelength-tunable filter. The light source 2 includes for example a rare-earth-doped fibre laser source. Hence, for example, an ytterbium-doped fibre laser source may be continuously tunable in wavelength over a spectral range of emission of the ytterbium extending from 974 nm to 1200 nm. This tunability may be obtained by inserting a discriminating element (such as for example a filter, a polarizing element or other) in a laser cavity, to introduce losses at the non-desired wavelengths. In another example, an erbium-doped fibre laser source may be continuously tunable over a spectral range of emission of the erbium around 1.5 µm. According to still another example, a thulium-doped fibre laser source may be continuously tunable over a spectral range of emission of the thulium around 2 micrometres (µm). Similarly, a neodymium-doped fibre laser source may be continuously tunable in wavelength over a spectral range around the emission wavelength of 900 nm. The rare-earth-doped fibre laser sources emit a temporally continuous light radiation 20 having a power of several hundreds of milliwatts and that is tunable in wavelength over a wide spectral range of several tens to hundreds of nm in the visible and/or the near infrared domain.

As an alternative, the light source 2 emits a polychromatic light radiation 20 comprising several discrete wavelengths in a spectral range extending over a few hundreds of nanometres, each discrete wavelength having a spectral width of the order of 10 kHz to 300 GHz.

The temporally continuous light radiation 20 is injected at the entry of the electro-optical modulator 4. The electro-optical modulator 4 is preferably an amplitude modulator of the Mach-Zehnder type. An electro-optical modulator 4 having an electronic bandwidth extending from 10 GHz to 20 GHz or from 5 GHz to 100 GHz is chosen. For example, the Mach-Zehnder electro-optical modulator 4 is an optical integrated circuit modulator, comprising an optical waveguide and electrodes. Advantageously, the electro-optical modulator 4 includes at least one optical fibre entry and one optical fibre exit. The electrodes of the Mach-Zehnder electro-optical modulator 4 are connected to a power generator 5.

The power generator 5 receives an external analog control signal 60 generated by the control unit and applies an analog electrical modulation signal 50 to the electrodes of the electro-optical modulator 4. In a variant that will be described in more detail hereinafter, the analog electrical modulation signal 50 is applied directly on the electrodes of a source laser diode 2.

More precisely, the power generator 5 includes a fast electronic board configured to generate an analog electrical modulation signal 50 comprising at least one electrical pulse of duration comprises between 10 ps and 10 ns. Advantageously, this electrical pulse has an amplitude comprises between 2 and 4 V, adapted to control the electro-optical modulator 4. By way of non-limitative example, the electronic board includes digital microwave electronic components operating in the 28 Gbps-32 Gbps or 100 Gbps domain. Such microwave electronic components are used in logic electronics for low-amplitude fast telecommunication signals, but are not adapted to provide analog signals. By way of non-limitative example, two logical gates, inverted relative to each other and connected by an electronic delay line, are used to generate an analog electrical pulse of duration comprised between 10 ps and 10 ns. The electronic delay line determines the duration of the analog electrical pulse. In an advantageous embodiment, the electronic delay line is of the variable delay type, in order to generate an analog electrical pulse of variable duration, comprised between 10 ps and 10 ns. However, the microwave logical electronical components do not allow controlling directly an electro-optical modulator of the Mach-Zehnder type. Indeed, such a modulator requires switching voltages of several volts. An operational amplifier system of wide bandwidth (about 20 GHz) allows generating an analog electrical modulation signal having an amplitude comprised for example between about 2 V and 4 V over a bandwidth extending from a few kHz to at least 5 GHz, and preferably to 10 GHz, 20 GHz or even 100 GHz.

Advantageously, the analog electrical modulation signal 50 is a periodic signal having a repetition frequency tunable for example from 50 kHz to at least 5 GHz. The power generator 5 hence generates an electrical pulse train with a rate tunable from 50 kHz to at least 5 GHz. The electrical pulse train may comprise electrical pulses of fixed duration or variable duration, comprised between 10 ps and 10 ns.

For example, a computer or a clock 6 sends an analog control signal 60 to a microwave electronic board as described hereinabove so as to generate an analog electrical modulation signal 50 temporally modulated in the frequency domain extending from a few kHz to several GHz or even several tens of GHz.

This power generator 5 allows having an analog electrical modulation signal 50 comprising an analog electrical pulse generated on demand or a train of analog electrical pulses (2-4 V) with a rate tunable from 50 kHz to at least 5 GHz, 10 GHz, 20 GHz or even 50 GHz and of variable duration (10 ps-10 ns). Moreover, such power generator 5 has advantages of low consumption and controlled cost.

Figure 2:
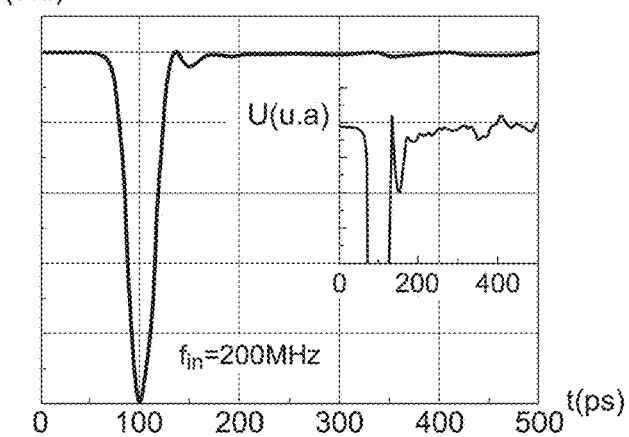
FIG. 2 shows an example of an analog electrical modulation signal comprising an electrical pulse, this analog electrical modulation signal being generated by the power generator.

FIG. 2 illustrates an example of analog electrical modulation signal 50 at the exit of an amplifier arranged at the exit of a power generator 5 as described hereinabove. The power generator 5 receives a control signal 60 at a frequency $f_{in}$ of 200 MHz and generates an analog electrical signal whose amplitude herein varies between −0.5 V and 0 V. However, in the photonic applications, it is important to control precisely the characteristics of the analog electrical modulation signal 50. In particular, the contrast of the analog electrical modulation signal 50 must be excellent, i.e. the ratio between the peak level of the electrical pulse and the level of the disturbances. As an insert in FIG. 2, is shown the analog electrical modulation signal 50 in logarithmic scale. It is observed that the amplitude of the bounces remains lower than 4%, which is very suitable for an electro-optical modulator of the Mach-Zehnder type.

This analog electrical modulation signal 50 may deliver a single analog electrical pulse and/or a periodic train of analog electrical pulses at a repetition frequency from 10 kHz to at least 5 GHz, or even 20 GHz or 50 GHz.

The generation of light pulses is made by means of a power generator 5, as that described hereinabove, which delivers electrical pulses of duration comprised between 10 ps and 10 ns, and a wide-bandwidth electro-optical modulator 4.

The analog electrical modulation signal 50 is applied between the electrodes of the electro-optical modulator 4. The electro-optical modulator 4 receives the temporally continuous light radiation 20 and modulates the amplitude of this light radiation 20 as a function of the analog electrical modulation signal 50, to generate a modulated light radiation 40. The electro-optical modulator 4 has an electronical bandwidth extending up to at least 5 GHz, for example up to 10 GHz, 20 GHz or 100 GHz. The analog electrical modulation signal 50 comprises at least one analog electrical pulse of duration comprised between 10 ps and 10 ns. Hence, the analog electrical modulation signal 50 induces a modulated light radiation 40 comprising at least one light pulse of duration comprised between 10 ps and 10 ns. In other words, the electro-optical modulator 4 converts optically the analog electrical modulation signal 50 into a modulated light radiation 40 comprising at least one light pulse of duration comprised between 10 ps and 10 ns.

Figure 3:
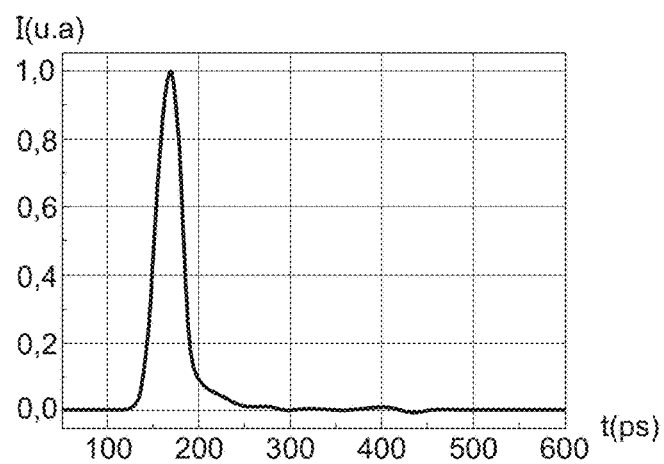
FIG. 3 shows an example of modulated light radiation generated at the exit of an electro-optical modulator to which is applied the analog electrical modulation signal of FIG. 2.

FIG. 3 illustrates an example of measurement of intensity of the modulated light radiation 40 at the exit of an electro-optical modulator 4 to which is applied the analog electrical modulation signal of FIG. 2. A light pulse is observed, which has a high contrast and a duration of about 25 ps, which is herein equal to the duration of the electrical pulse applied. The electro-optical modulator 4 hence generates directly a light pulse of duration lower than 100 ps. The electro-optical modulator 4 can hence deliver a single light pulse of duration comprised between 10 ps and 10 ns or a light pulse train at a repetition frequency able to go from 10 kHz to 5 GHz, 20 GHz or even 50 GHz, as a function of the analog electrical modulation signal 50.

The system consisted of a light source 2, a power generator 5 and an electro-optical modulator 4 as described hereinabove hence makes it possible to temporally cut the continuous light radiation of the light source 2 to produce picosecond light pulses having a very high signal-to-noise ratio and a well-controlled temporal shape. These light pulses may have an adjustable rate while having a stable amplitude.

Firstly, this system makes it possible to easily electronically adjust the duration of the light pulses in a wide range of durations. Thereafter, such a system makes it possible to easily electronically adjust the repetition frequency of the light pulses in a wide range of frequencies, without generating instabilities. This system hence makes it possible to reach a high repetition frequency domain. Moreover, this system also makes it possible to reach a low repetition frequency domain, which is difficult to reach with a conventional light pulse selection device (or pulse-picker).

Particularly advantageously, the light pulse generation system further includes a compressor 8, for example a conventional spectral compressor based on diffraction gratings and/or prism. The compressor 8 makes it possible to temporally compress a previously chirped or shaped light pulse of duration comprised between 10 ps and 100 ps in order to generate a spectrum having a phase relation between its different spectral components into a light pulse of femtosecond duration, i.e. lower than 1 ps. A femtosecond source is hence produced, which is compact, and easily tunable in duration, rate and/or wavelength.

Figure 4:
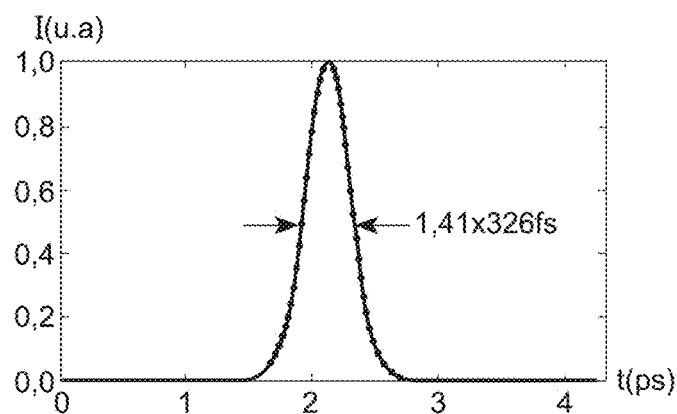
FIG. 4 shows an example of ultra-short light pulse obtained after compression of the modulated light radiation of FIG. 3.

FIG. 4 illustrates a measurement of temporally compressed light pulse at the exit of a system as schematically shown in FIG. 1 and comprising a compressor 8. The compressor receives a light pulse of duration of the order of 50 ps, as illustrated in FIG. 3, and generates an ultra-short light pulse 100. In FIG. 4 is shown a curve of Gaussian adjustment of the temporal profile of the light pulse 100. The duration of the light pulse, which is herein equal to about 460 fs in auto-correlator duration, i.e. about 326 fs in real duration, is hence determined.

According to a variant, the power generator 5 applies electrical pulses directly to the electrodes of the light source 2, which is for example a signal laser diode having electrodes to supply it with electrical current. In this variant, the electro-optical modulator 4 is omitted. That way, the diode directly generates as an output a modulated light radiation 40 comprising light pulses having a duration comprised between 50 ps and several ns and with a rate comprised in a range from 0 to 1 GHz. In order to reduce the pulse duration, the signal diode may be gain switched by direct application of electrical control pulses to its electrodes in order to obtain light pulses of duration comprised between 5 and 50 ps at a rate comprised between 0 and 10 GHz. As an alternative, the amplitude of the electrical current applied to the electrodes of the laser diode is modulated to directly generate light pulses of duration comprised between 5 and 50 ps at a rate comprised between 0 and 10 GHz.

According to a particular aspect, described in connexion with FIG. 5, the system further includes a feedback loop to control the signal-to-noise ratio of the modulated light radiation. An optical coupler 19 is arranged at the exit of the electro-optical modulator and configured to pick-up a small portion (for example 1%) of the modulated light radiation

40. A detection system 9 is configured to measure an intensity of the portion of the modulated light radiation in a bandwidth going up to several tens of gigahertz. A microwave electronic board makes it possible to analyse this measure and to generate a bias signal as a function of a measurement of contrast, of signal-to-noise ratio or of level of extinction of the modulated light signal 40. An analog electronic feedback signal hence makes it possible to apply a bias voltage to the electro-optical modulator 4 as a function of the bias signal. This feedback device makes it possible to adapt the voltage applied to the electro-optical modulator as a function, for example, of the extinction of the modulated light beam. This feedback device makes it possible to maintain an excellent signal-to-noise ratio and a high contrast of the electro-optical modulator 4 over the whole range of pulse duration and rate.

In a particular embodiment described in connection with FIG. 6, the system for generating short or ultra-short light pulses further includes an optical amplification device arranged at the exit of the electro-optical modulator 4. The optical amplification device includes an optical amplifier or several optical amplifiers arranged in series to receive the modulated light radiation 40 and to generate an amplified pulse light radiation. For example, the optical amplification device includes a first optical preamplifier 10, another optical preamplifier 11 and an optical power amplifier 12. Optical amplifiers based on doped optical fibres (Yb, Er, Th and/or Nd) and/or crystal and/or doped-glass amplifiers (for example, Yb:YLF, Yb:YAG, Yb:CALGO, Yb:CaF2, Yb:LUAG, Nd:YAG, or Er:YAG or Ho:YAG) are for example used. Between the different amplification stages are advantageously arranged optical filters of fixed or tunable wavelength, synchronized between each other, making it possible to eliminate the amplified spontaneous emission generated in the optical amplifiers.

The temporal compression technique makes it possible to produce a light source generating light pulses having a duration lower than 10 ps, for example picosecond or femtosecond.

Advantageously, a spectral broadening device is used before the power amplification stage, in order to broaden the spectrum of the light pulse previously to the amplification thereof. Hence, the optical amplification device generates an amplified light pulse having a temporally chirped spectrum that may then be temporally recompressed by means of a dispersion compressor. As known, it is then possible, after amplification, to temporally recompress the amplified light pulse to reach a picosecond or femtosecond duration. The compressor 8 may be based on diffraction grating(s), prism(s), dispersive mirror(s) and/or optical fibre(s) having a particular dispersion.

A first exemplary embodiment lies on the use of a dispersive module 7. By way of non-limitative example, the dispersive module 7 comprises a long length (between 30 m and 300 m) of polarization maintaining PM fibre and/or photonic crystal fibre (PCF) or step index passive optical fibre. By nonlinear effects such as self-phase modulation (SPM), such an optical fibre produces a spectral broadening of a light pulse. Indeed, the phase variations accumulated by SPM during the propagation of the light pulse in the optical fibre induce changes in the temporal envelop of the pulse without modification of the amplitude thereof. As known, in the frequency domain, these phase variations translate into a spreading of the pulse spectrum, because the latter is the derivative of the non-linear phase shift. The self-phase modulation has for effect to shift the low-frequency components towards the pulse front and the high-frequency components towards the pulse tail, which is the reverse of the dispersion effects in anomalous regime produced by the silica fibres for wavelengths of the order of 1 μm.

Another exemplary embodiment relies on the use of a nonlinear polarization rotation (RNLP) module 17 arranged between the second pre-amplification stage 11 and the power amplifier 12. FIG. 7 illustrates the structure and the operation of an RNLP module 17. The RNLP module 17 herein includes a polarizing element 171, a passive (non PM) optical fibre 173 and a polarization controller 172. A light pulse 40 sees its polarization evolve non linearly during its propagation in the optical fibre 173 by Kerr effect. After a polarizer 171 (or isolator), an incident pulse 40 ends up with all its components linearly polarized. The polarization controller 172 makes it possible to change the linear polarization into an elliptical polarization. The elliptically polarized light pulse undergoes a nonlinear evolution of its polarization state during its propagation in the optical fibre 173. This is due to the combined effects of the self-phase modulation and of the cross-phase modulation induced in the two components of the polarization by Kerr effect. The different temporal components of the light pulse do not perceive the same refractive index, because it depends on the peak intensity, which changes the polarization state and induces a phase-shift between the different components of the light pulse. As a consequence, the most intense part of the light pulse, represented in thick line in FIG. 7, undergoes a polarization rotation by an angle that depends on the maximum of the electrical field intensity, hence changing the position of the ellipse axis. On the contrary, the less intense part of the light pulse, represented in thin line in FIG. 7, undergoes no polarization rotation. The angle of rotation of the polarization is hence proportional to the intensity. At the exit of the optical fibre 173, another polarization controller 174 is oriented so as to compensate for the linear birefringence of the fibre to transform an elliptical polarization state into a linear polarization state. Finally, another polarizer 175 is arranged to analyse the polarization by letting through the most intense part of the light pulse whose polarization has been rotated. This intense part then undergoes less losses than the less intense part of the light pulse. The light pulse 100 obtained has hence a reduced duration. In this exemplary embodiment, it is not necessary to use a compressor. The exemplary embodiment has advantages of ease of use and limited cost.

Still another example of implementation lies on the use of a frequency conversion module 27 operating by degenerated four-wave mixing (FWM) after the last amplification stage. Such a module 27 makes it possible to generate a new wavelength, preferably in the visible domain, with a spectral broadening due to the cross-phase modulation. The spectral band, of several nanometres, obtained by FWM and by spectral broadening, makes it possible to recompress a light pulse having a duration of a few picoseconds at a duration of the order of about hundred femtoseconds. Indeed, the degenerated FWM appears when two identical pump photons are annihilated to produce two photons with different wavelengths and the same total energy. When several waves of different wavelengths propagate in an optical fibre, the beats thereof create, via the optical Kerr effect and the diffraction effects, an index grating. This periodic modulation of the index induces a physical process of energy transfer between the frequencies that, by temporal diffraction, is liable to generate new frequencies. These latter, due to the energy conservation condition, are particular combinations of the initial frequencies. The simultaneous propagation of these different waves in a same optical fibre causes, by cross-phase modulation (XPM), a spectral broadening of the pulse. This effect is a direct consequence of the optical Kerr effect that is expressed by the modification of the refractive index of a medium under the effect of an intense electrical field. Indeed, when two waves propagate simultaneously in an optical fibre, one of them undergoes the effects of the first one on the medium, and reciprocally. Hence, a pulse will undergo a nonlinear phase shift induced by a second pulse. These light pulses may hence be compressed at durations lower than 1 ps. In this case, the compressed light pulse has a lower duration than that of the electrical pulse applied to the electro-optical modulator 4.

FIG. 8 illustrates an example of use of the system for generating short or ultra-short light pulses comprising an infrared light source 2 emitting around 1 μm and an FWM device configured so as to generate light pulses having a wavelength-tunable emission spectrum. A system for generating short or ultra-short light pulses that is continuously tunable in wavelength from 750 nm to about 900 nm is hence produced.

The system for generating short or ultra-short light pulses as described in one of the embodiments described in detail hereinabove opens new prospects in the field of the laser methods. For example, in a pulse light beam displacement system based on the movements of a galvanometric head or an F-Theta lens, the accelerations and decelerations of the movements harm the uniformity of the energy deposition. The system object of the present disclosure makes it possible to synchronize in real time the rate of the light pulses with a light beam displacement system and hence to perform a laser processing with a constant deposition of energy, taking into account the accelerations of the beam deviation system. The ease of duration and/or rate tunability of the light pulses hence makes it possible to improve the accuracy and the regularity of a laser processing. Moreover, this system makes it possible to adapt a laser method in a multiple parameter range and over a very wide dynamics because it is possible to adjust at the same time the wavelength, the rate and the duration of the pulses during the laser operation in order to adapt the interactions of the laser with the material. It is hence possible to process in continuous elements of inhomogeneous composition while keeping optimum laser parameters, with a single one light source.

In a particular embodiment, the system for generating short or ultra-short light pulses also finds applications in a system and method of full field imaging based on a multiphoton fluorescence excitation adapted to the biological studies on living cells and tissues. The multiphoton imaging is based on a nonlinear phenomenon, in which the signal varies in inverse proportion to the square of the pulse duration. On the other hand, the system for generating short or ultra-short light pulses makes it possible to adjust the rate of emission of the light pulses over a frequency range that extends from a few kHz to several GHz. This rate range is unattainable by the present technologies and makes it possible to finely adjust the signal-to-noise ratio as a function of the target imaged while remaining in a range of non-destructive light pulses.

According to a particular and advantageous embodiment, the system for generating short or ultra-short light pulses implements the ytterbium-doped optical fibre technology. The ytterbium-doped optical fibre is particularly adapted to the amplification up to mean powers of more than 50 W, to be compared with the few W provided by a conventional optical oscillator. It is then possible to illuminate a zone of several cm² and to form a full field image. By way of comparison, the present laser imaging technologies are generally based on a focusing of a laser beam to a point of 50 μm², a scanning of the surface to be imaged and a point-by-point reconstruction of the image, which makes these techniques extremely long. On the contrary, the imaging in combination with the system for generating short or ultra-short light pulses proposed herein hence constitutes a real technological breakthrough because the image is obtained by a single operation. An ultrafast camera makes it possible to accede to the temporal dynamics, for example to follow the evolution of biological cells, which was previously unattainable by point-by-point reconstruction of image.

The invention claimed is:

1. A system (1) for generating short or ultra-short light pulses comprising:
a light source (2) adapted to emit a light radiation (20);
a power generator (5) that includes a microwave electronic board comprising two logical gates, the two logical gates being inverted relative to each other and connected by an electronic variable delay line, the power generator (5) being configured to operate at a frequency tunable over a bandwidth extending up to at least one gigahertz and to emit an analog electrical modulation signal (50) comprising at least one electrical pulse of duration determined by the electronic variable delay line, the duration of the electrical pulse being comprised between 10 picoseconds and 10 nanoseconds;
electrical or electro-optical modulation means having an electrical bandwidth adapted to receive the analog electrical modulation signal (50), the electrical or electro-optical modulation means being configured to modulate the light radiation (20) in amplitude as a function of the analog electrical modulation signal (50) and to generate a modulated light radiation (40) comprising at least one light pulse of duration comprised between 10 ps and 10 nanoseconds.

2. The system according to claim 1, wherein the power generator (5) is configured to emit the analog electrical modulation signal (50) comprising said at least one electrical pulse of duration comprised between 10 ps and 10 nanoseconds and wherein the light source (2) comprises a laser diode having electrodes, said modulation means being configured to apply said analog electrical modulation signal (50) to the electrodes of the laser diode.

3. The system according to claim 2, wherein the power generator (5) is configured to operate at a frequency tunable over a bandwidth extending up to at least ten gigahertz and to emit the analog electrical modulation signal (50) comprising said at least one electrical pulse of duration comprised between 10 ps and 50 ps and wherein the laser diode is gain switched, so that the laser diode generates the modulated light radiation (40) comprising at least one light pulse of duration comprised between 10 ps and 50 ps at a rate extending up to at least ten gigahertz.

4. The system according to claim 1, wherein:
the light source (2) is adapted to emit a temporally continuous light radiation (20),
the power generator (5) is configured to operate at a frequency tunable over a bandwidth comprised between one gigahertz and one hundred of gigahertz and to emit the analog electrical modulation signal (50) comprising said at least one electrical pulse of duration comprised between ten picoseconds and one hundred of picoseconds; and
the system further comprises an electro-optical modulator (4) having electrodes and an electrical bandwidth adapted to receive the analog electrical modulation signal (50), the electro-optical modulator being configured to optically modulate the continuous light radiation (20) in amplitude as a function of the analog electrical modulation signal (50) and to generate a modulated light radiation (40) comprising said at least one light pulse of duration comprised between ten picoseconds and about one hundred picoseconds.

5. The system according to claim 4, wherein the power generator is configured to emit said analog electrical modulation signal (50) comprising an electrical pulse train of duration comprised between 10 ps and 10 ns at a rate tunable over a frequency range comprised between 10 kHz and 20 GHz and wherein the electro-optical modulator is configured to modulate the continuous light radiation as a function of the analog electrical modulation signal (50) and to generate a modulated light radiation (40) comprising a train of light pulses of duration comprised between 10 ps and 10 ns, said light pulses having said tunable rate.

6. The system according to claim 1, further comprising a compressor (8) configured to receive said at least one light pulse of duration comprised between ten picoseconds and one hundred of picoseconds and to generate a compressed light pulse (100) of duration lower than or equal to one picosecond.

7. The system according to claim 6, further comprising at least one optical device (7, 17, 27) arranged between the light source (2) and the compressor (8), the optical device (7, 17, 27) being chosen among a spectrally dispersive optical device (7), a polarizing optical device (17) or a nonlinear optical device (27).

8. The system according to claim 1, wherein the light source (2) is configured to emit a monochromatic or polychromatic continuous light radiation.

9. The system according to claim 1, comprising a device for tuning a wavelength of the light radiation (20).

10. The system according to claim 1, wherein the light source comprises laser diode or a rare-earth-doped optical fibre laser source, chosen among an erbium, ytterbium, thulium or neodymium-doped optical fibre laser source.

11. The system according to claim 1, comprising an optical amplification device (10, 11, 12) configured to receive the modulated light radiation (40) and to generate an amplified pulse light radiation.

12. The system according to claim 1, comprising an optical coupler arranged at the exit of the electrical or electro-optical modulation means and configured to pick-up a portion of the modulated light radiation, a detection system configured to measure an intensity of the portion of the modulated light radiation in a bandwidth extending up to at least one gigahertz and a feedback loop arranged to apply a bias signal to the modulation signal as a function of the intensity measured.

13. A method for generating short or ultra-short light pulses comprising the following steps:
   emitting a light radiation (20),
   using a power generator (5) including a microwave electronic board, the microwave electronic board comprising two logical gates, the two logical gates being inverted relative to each other and connected by an electronic variable delay line for generating an analog electrical modulation signal (50) having a frequency in a microwave bandwidth comprised between 10 kHz and 20 GHz, the analog electrical modulation signal comprising at least one electrical pulse of duration comprised between 10 picoseconds and 10 nanoseconds;
   applying the analog electrical modulation signal to the electrodes of an electro-optical modulator or of a laser diode, the electro-optical modulator or the laser diode being configured to optically modulate the light radiation (20) in amplitude as a function of the analog electrical modulation signal (50) and to generate a modulated light radiation (40) comprising at least one light pulse of duration comprised between 10 ps and 10 nanoseconds.

14. The method according to claim 13, wherein the laser diode is gain switched, so that the laser diode generates the modulated light radiation comprising at least one light pulse of duration comprised between 10 ps and 50 ps at a rate extending up to at least ten gigahertz.

15. The system according to claim 2, comprising a device for tuning a wavelength of the light radiation (20).

16. The system according to claim 3, comprising a device for tuning a wavelength of the light radiation (20).

17. The system according to claim 4, comprising a device for tuning a wavelength of the light radiation (20).

18. The system according to claim 5, comprising a device for tuning a wavelength of the light radiation (20).

19. The system according to claim 6, comprising a device for tuning a wavelength of the light radiation (20).

* * * * *